(12) United States Patent
Oudard et al.

(10) Patent No.: US 10,131,571 B2
(45) Date of Patent: Nov. 20, 2018

(54) METHODS OF FORMING OPTICAL SYSTEM COMPONENTS AND OPTICAL COATINGS

(71) Applicant: Corning Incorporated, Corning, NY (US)

(72) Inventors: Jean-Francois Oudard, Webster, NY (US); James Edward Platten, Penfield, NY (US); Jue Wang, Fairport, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/593,961

(22) Filed: May 12, 2017

(65) Prior Publication Data

US 2017/0247290 A1    Aug. 31, 2017

Related U.S. Application Data

(62) Division of application No. 15/250,076, filed on Aug. 29, 2016, now abandoned.

(Continued)

(51) Int. Cl.
  *C23C 16/40* (2006.01)
  *C23C 16/50* (2006.01)
  (Continued)

(52) U.S. Cl.
  CPC ........ *C03C 17/3417* (2013.01); *C03C 17/245* (2013.01); *C03C 17/2456* (2013.01); *C23C 16/402* (2013.01); *C23C 16/405* (2013.01); *C23C 16/513* (2013.01); *G02B 1/115* (2013.01); *G02B 1/12* (2013.01); *G02B 1/18* (2015.01); *H01J 37/32009* (2013.01); *C03C 2217/213* (2013.01); *C03C 2217/218* (2013.01);

(Continued)

(58) Field of Classification Search
  CPC ........ C23C 16/40; C23C 16/50; C23C 16/517
  See application file for complete search history.

(56) References Cited

U.S. PATENT DOCUMENTS 4,285,730 A    8/1981  Sanford
5,789,040 A *  8/1998  Martinu ................ C23C 16/517
                                              427/255.5

(Continued)

FOREIGN PATENT DOCUMENTS

DE       3942990        6/1991
EP       2816379        12/2014
JP       1-221914    *  9/1989

OTHER PUBLICATIONS

Wang, Xinrong, et al., "Helicon plasma deposition of a TiO2/SiO2 multilayer optical filter with graded refractive index profiles". Applied Physics Letters, vol. 72, No. 25, Jun. 22, 1998, pp. 3264-3266.*

(Continued)

*Primary Examiner* — Bret P Chen
(74) *Attorney, Agent, or Firm* — Robert L. Carlson (57) ABSTRACT

A method of forming an optical coating, including the steps: depositing a buffer layer on a glass substrate via plasma deposition at a first plasma bias voltage; and depositing at least one layer of an optical coating on the buffer layer via plasma deposition, the deposition of the optical coating carried out at a second plasma bias voltage.

19 Claims, 6 Drawing Sheets

Related U.S. Application Data (60) Provisional application No. 62/215,286, filed on Sep. 8, 2015.

(51) Int. Cl.

| | | |
|---|---|---|
| *C03C 17/34* | (2006.01) | |
| *G02B 1/18* | (2015.01) | |
| *H01J 37/32* | (2006.01) | |
| *C23C 16/513* | (2006.01) | |
| *G02B 1/115* | (2015.01) | |
| *G02B 1/12* | (2006.01) | |
| *C03C 17/245* | (2006.01) | |

(52) U.S. Cl.
CPC .. *C03C 2217/734* (2013.01); *C03C 2218/153* (2013.01); *H01J 2237/327* (2013.01); *H01J 2237/3321* (2013.01)

(56) References Cited

U.S. PATENT DOCUMENTS

| | | | | |
|---|---|---|---|---|
| 6,495,202 | B1* | 12/2002 | Taki | G03F 7/70216 |
| | | | | 427/162 |
| 8,399,110 | B2 | 3/2013 | Cangemi | |
| 2002/0030882 | A1 | 3/2002 | Vitt | |
| 2003/0202770 | A1* | 10/2003 | Garito | G02B 6/1221 |
| | | | | 385/141 |
| 2005/0286827 | A1 | 12/2005 | Scheible et al. | |
| 2007/0099001 | A1 | 5/2007 | Melchior | |
| 2007/0146868 | A1 | 6/2007 | Yamaguchi | |
| 2008/0185041 | A1* | 8/2008 | Sharma | C03C 17/009 |
| | | | | 136/261 |
| 2008/0265419 | A1* | 10/2008 | Frohberg | H01L 21/76843 |
| | | | | 257/753 |
| 2009/0075092 | A1* | 3/2009 | Varaprasad | H01L 31/18 |
| | | | | 428/428 |
| 2010/0180950 | A1* | 7/2010 | Gao | B82Y 10/00 |
| | | | | 136/265 |
| 2013/0135712 | A1* | 5/2013 | Schreiber | C23C 16/405 |
| | | | | 359/350 |
| 2013/0314648 | A1 | 11/2013 | Rappoport | |
| 2014/0078589 | A1* | 3/2014 | Fujii | G02B 1/115 |
| | | | | 359/601 |
| 2015/0241605 | A1 | 8/2015 | Cox | |

OTHER PUBLICATIONS

Stoner, B.R., et al., "Textured diamond growth on (100) B—SiC via microwave plasma chemical vapor deposition". Applied Physics Letters, vol. 60, No. 6, Feb. 10, 1992, pp. 698-700.*

Han, Jaehee, et al., "Tip growth model of carbon tubules grown on the glass substrate by plasma enhanced chemical vapor deposition". Journal of Applied Physics, vol. 91, No. 1, Jan. 1, 2002, pp. 483-486.*

Lopez, Gabriel P., et al., "Glow discharge plasma deposition of tetraethylene glycol dimethyl ether for fouling-resistant biomaterial surfaces". Journal of Biomedical Materials Research, vol. 26, 415-439 (1992).*

Jue Wang et al., Elastic and plastic relaxation of densified SiO2 films, Applied Optics, vol. 47, Issue 13, pp. C131-C134 (2008).

Jue Wang et al., Crystal phase transition of HfO2 films evaporated by plasma-ion-assisted deposition, Applied Optics, vol. 47, Issue 13, pp. C189-C192 (2008).

International Searching Authority Invitation to Pay Additional Fees, PCT/US2016/050652 dated Dec. 14, 2016.

Jue Wang, "Oxide-fluoride hybrid ArF laser optics coatings," REDLINES Journal 3(4), Nov. 2008, 3 PGS.

Jue Wang, "Surface and interface mitigation of DUV mirrors," REDLINES Journal 3(6), Nov. 2009, 7 PGS.

* cited by examiner

METHODS OF FORMING OPTICAL SYSTEM COMPONENTS AND OPTICAL COATINGS

This application is a divisional of and claims the benefit of priority under 35 U.S.C. § 120 of U.S. patent application Ser. No. 15/250,076, filed on Aug. 29, 2016, now abandoned, which claims the benefit of priority under 35 U.S.C. § 119 of U.S. Provisional Application Ser. No. 62/215,286 filed on Sep. 8, 2015 the content of which is relied upon and incorporated herein by reference in its entirety.

BACKGROUND

The present disclosure relates generally to optical system components, and more particularly, optical system components having one or more optical coatings thereon.

Optical system components are designed to facilitate the transmission and shaping of visible and non-visible wavelengths of the electromagnetic spectrum such as light. Typically, these optical system components utilize one or more optical coatings to aid in the successful transmission of the light. Occasionally, the coating or application of the coating may harm the underlying material of the optical system components and thereby interfere with the transmission of light.

SUMMARY

According to one embodiment of the present disclosure, an optics system component having a stainable glass substrate, an optical coating comprising alternating layers of dielectric materials, and a buffer layer positioned on the stainable glass substrate between the substrate and the optical coating, wherein the buffer layer comprises a dielectric material and has a thickness of less than about 20 nm.

According to another embodiment of the present disclosure, a method of forming an optical system component, having the steps of providing a glass substrate comprising one or more fluorides, the glass substrate having a thermal damage threshold, depositing a first portion of a first layer of an optical coating via plasma deposition on the glass substrate at a first plasma bias voltage, depositing a second portion of the first layer of the optical coating via plasma deposition on the first portion at a second plasma bias voltage, wherein the second plasma bias voltage is greater than the first plasma bias voltage, and depositing a second layer of the optical coating on the first layer.

According to yet another embodiment of the present disclosure, a method of forming an optical coating, having the steps of providing a glass substrate, depositing a buffer layer on the substrate via plasma deposition at a first plasma bias voltage, and depositing at least one layer of an optical coating on the buffer layer via plasma deposition, the deposition of the optical coating carried out at a second plasma bias voltage. The second plasma bias voltage is greater than the first plasma bias voltage.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments.

DETAILED DESCRIPTION

Reference will now be made in detail to the present preferred embodiments, examples of which are illustrated in the accompanying drawings. Whenever possible, the same reference numerals will be used throughout the drawings to refer to the same or like parts.

For purposes of description herein, the terms "upper," "lower," "right," "left," "rear," "front," "vertical," "horizontal," and derivates thereof shall relate to the disclosure as oriented in FIG. 1, unless stated otherwise. However, it is to be understood that the optical probe 10 may assume various alternative orientations, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Depicted in FIGS. 1-5B is an optics system component 10 including a substrate 14 configured to transmit electromagnetic radiation, an optical coating 18 having alternating layers of dielectric materials, and a buffer layer 22 positioned on the substrate between the substrate 14 and the optical coating 18.

Figure 1A:
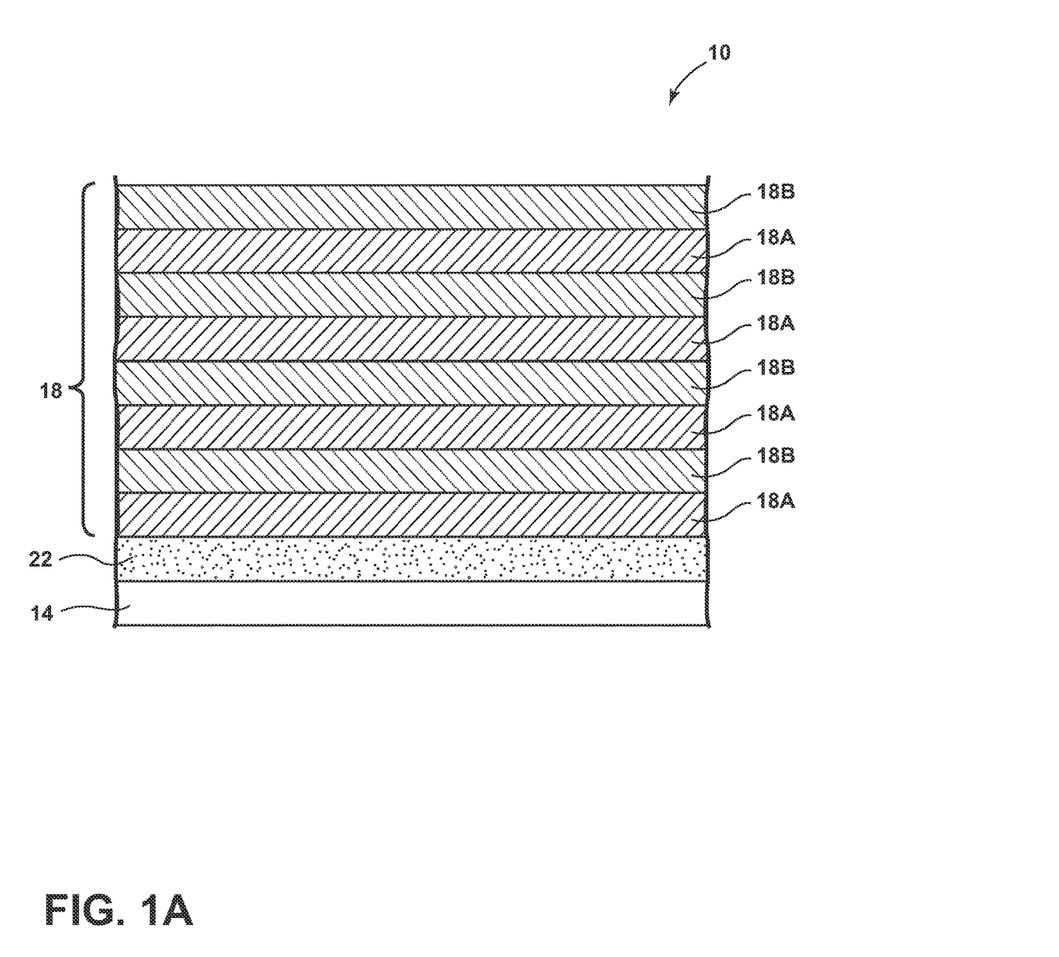
FIG. 1A is an enlarged cross-sectional view of an optics system component showing the layers thereof according to one embodiment of the disclosure.

Referring now to FIG. 1, the optics system component 10 may be a lens (e.g., convex and/or concave), a prism, a fiber optic end, beam splitter, or other object configured to transmit both visible and non-visible electromagnetic radiation (e.g., light) there through. The optics system component 10 includes the substrate 14 on which the optical coating 18 is positioned. The substrate 14 may be a glass, glass-ceramic, ceramic, or polymeric material that is sufficiently translucent to allow the transmission of electromagnetic radiation (e.g., visible and non-visible light) through the optics system component 10. In various embodiments, the substrate 14 is substantially composed of glass which is prone to optical degradation under certain environmental conditions. For example, the glass may be "stainable," or subject to chemical reactions with its environment under certain conditions which may cause a decrease in optical performance (e.g., transmittance of light or shaping of light) of the optics system component 10. For example, the decrease in optical performance may result in a decreased transmittance of a band or wavelength of light (e.g., short wavelength blue light). Stainable glass may be subject to chemical reactions due to the chemical constituents present within the glass of the substrate 14. In an exemplary embodiment, the chemical constituents attributable to stainability may be fluorides such as $SrF_2$, $BaF_2$, $MgF_2$, $CaF_2$, $AlF_3$, KF, NaF, and other fluorides. The fluorides may be present in stainable glasses between about 0.1 wt % and about 70 wt %, or between about 1.0 wt % and about 40 wt %. Such glasses may have a temperature damage threshold, or point where they experience damage from high temperatures. The temperature damage threshold may be below about 700° C., below about 600° C., below about 500° C., or below about 400° C. The low melting temperatures of the stainable glass may also contribute to the decrease in optical performance of the substrate 14. The chemical constituents of the stainable glass, as well as its low melting temperature, may limit the type or manner of application of the optical coating 18 that may be applied to the substrate 14.

Referring again to FIG. 1A, the optics system component 10 may include the optical coating 18. The optical coating 18 may be a variety of coatings configured to provide a specific, or multiple, effects to the optics system component 10. For example, the optical coating 18 may be a spectral filter coating (e.g., bandpass filter and/or edgepass filter) a beamsplitter coating (e.g., dichroic filter), a high reflective coating (e.g., metallization using gold or silver), and/or an antireflective coating (e.g., both spectral and angle of incidence). In various embodiments, the optical coating 18 is an antireflection coating including a first dielectric layer 18A and a second dielectric layer 18B. The first and second dielectric layers 18A, 18B are arranged in a dielectric stack configuration. It should be understood that although depicted with one dielectric stack, the optical coating 18 may have two or more stacks of the first or second dielectric layers 18A, 18B. The optical coating 18 may contain between two and ten layers (e.g., the first and second dielectric layers 18A, 18B). The first and second dielectric layers 18A, 18B are positioned in an alternating manner and comprise a dielectric material. Exemplary dielectric materials include $SiO_2$, $Ta_2O_5$, $NbO_5$, $TiO_2$, $HfO_2$, and combinations thereof. In some embodiments, each layer 18A, 18B may be a single dielectric material. In a specific embodiment, the first dielectric layer 18A may be $SiO_2$ and the second dielectric layer 18B may be $Ta_2O_5$. The thickness of the first and second dielectric layers 18A, 18B may each be between about 5 nm and about 500 nm. In some embodiments, the thickness of the first and second dielectric layers 18A, 18B may be different than one another and optionally vary across the thickness of the optical coating 18. In some embodiments, the choice of which dielectric material to use for the alternating first and second dielectric layers 18A, 18B may be based on the refractive index of the material in order to increase or decrease a reflectivity of the optics system component 10. For example, a high refractive index material (e.g., $Ta_2O_5$, $NbO_5$, $TiO_2$, $HfO_2$) may be included in the first dielectric layer 18A and a low refractive index material (e.g., $SiO_2$) may be included in the second dielectric layer 18B. In various embodiments, high refractive index materials may have indices greater than about 1.8, greater than about 1.9, greater than about 2.0, or greater than about 2.1. In various embodiments, low index of refraction materials may have refractive indices of less than about 1.6, less than about 1.5, or less than about 1.4. In some embodiments, the upper most layer (e.g., first or second dielectric layer 18A, 18B) comprises a high refractive index material (e.g., $Ta_2O_5$, $Nb_2O_5$, $TiO_2$, $HfO_2$). Additionally or alternatively, the upper most layer may be thinner (e.g., half or quarter the thickness of the wavelength of the electromagnetic radiation being passed through the optics system component 10) or thicker than the other layers (e.g., first or second dielectric layers 18A, 18B).

In various embodiments, the buffer layer 22 is positioned on top of the substrate 14 between the substrate 14 and the optical coating 18. The buffer layer 22 may include a low index of refraction material. For example, the buffer layer may include $SiO_2$. The buffer layer may have a thickness of between about 1 nm and about 20 nm, or between about 5 nm and about 15 nm. In specific embodiments, the thickness of the buffer layer 22 may be about 7 nm, about 8 nm, about 9 nm, about 10 nm, about 11 nm, or about 12 nm.

The optical coating 18 and the buffer layer 22 may be applied to the substrate 14 via a plasma enhanced chemical vapor deposition process using a plasma reactor. During plasma deposition, the substrate 14 is placed within a vacuum chamber of the plasma reactor. The substrate 14 may be part of a larger work piece from which the substrate 14 will later be cut, or just the substrate 14 may be placed in the vacuum chamber. The vacuum chamber is then decompressed to a pressure of between about 760 Torr and about $10^{-12}$ Torr, or between about 25 Torr and about $10^{-9}$ Torr. Provided within the plasma reactor is a coating material (e.g., $Ta_2O_5$, $Nb_2O_5$, $TiO_2$, $HfO_2$, $SiO_2$, and mixtures thereof) used to produce the optical coating 18 and/or the buffer layer 22. The coating material is vaporized and passed into a plasma stream. The plasma stream may be composed of a gas or element which has a high percentage of ionization. The gas used to form the plasma may be air, noble gases (e.g., He, Ar, Ne, Kr), Oxygen, Nitrogen, gases with low ionization potentials, and mixtures thereof. In various embodiments, the coating material may react with the plasma stream in order to aid in the deposition of the coating material. The plasma deposition of the optical coating 18 is carried out at a plasma bias voltage which facilitates the movement of the plasma and coating material toward the substrate 14 and densification of the optical coating 18. The plasma bias voltage may range from about 30 V to about 240 V. In various embodiments, application of the optical coating 18 may be performed at different plasma bias voltages. Additionally or alternatively, the buffer layer 22 may be applied at a plasma bias voltage different than that of at least a portion of the optical coating 18. The plasma deposition of the optical coating 18 and the buffer layer 22 may take place at a rate of between about 0.01 nm/s and about 10 nm/s, or between about 0.1 nm/s and about 1.0 nm/s. The deposition rate may be variable across the buffer layer 22 and/or optical coating 18, or the deposition rate may be variable. The surface roughness and the relative packing density of the optical coating 18 and buffer layer 22 may be controlled based on the plasma bias voltage and/or deposition rate. For example, the relative packing density of the buffer layer 22 or the first and second dielectric layers 18A, 18B of the optical coating 18 may be greater than about 80%, greater than about 85%, greater than about 90%, greater than about 95%, or approximately that of the bulk density of the material of the buffer layer 22.

As explained above, materials forming the substrate 14 which are subject to damage from the environment (e.g., stainable glasses, polymers) or have a low thermal damage threshold may be harmed during the deposition of the buffer layer 22 and the optical coating 18 due to the temperatures and conditions generated during plasma deposition of the optical coating 18 and buffer layer 22. Accordingly, it may be advantageous to apply the buffer layer 22 at a lower bias voltage than the optical coating 18. For example, the buffer layer may be applied at a plasma bias voltage of between about 50 V and about 90 V, or about 55 V to about 85 V. Thereafter, the optical coating 18 may be applied at a voltage between about 100 V and about 130 V, or between about 110 V and about 120 V. Typically, a lower plasma bias voltage is non-ideal as it may reduce the packing density of the buffer layer 22 and/or the optical coating 18 which may lead to a change in optical properties (e.g., refractive index) of the optics system component 10. However, the use of the lower plasma bias voltage to apply the buffer layer 22 may decrease or eliminate damage to the substrate 14 which might otherwise decrease the optical performance of the optics system component 10. Additionally, by applying the buffer layer 22 before the optical coating 18, the buffer layer 22 shields the substrate 14 from high plasma energies capable of damaging the substrate 14 such that the optical coating 18 may be applied at higher plasma bias voltages, thereby leading to greater packing densities and overall increased performance of the optical coating 18.

Use of the buffer layer 30 between the optical coating 18 and the substrate 14 may allow for the realization of several advantages. The thinness of the buffer layer 22, which was deposited at a non-ideal plasma bias voltage, relative to the thickness of the optical coating 18, which was deposited at an ideal plasma bias voltage, may lead to low (e.g., less than about 1.0%, less than about 0.5%, less than about 0.4%, less than about 0.3%, less than about 0.2%, and less than about 0.1%) transmittance loss of electromagnetic radiation through the optics system component 10. The transmittance loss may be low between wavelengths of about 150 nm to about 1000 nm, or between about 400 nm and about 800 nm. Additionally, the application of the buffer layer 22 may aid in the adhesion of the optical coating 18 to the substrate 14.

Figure 1B:
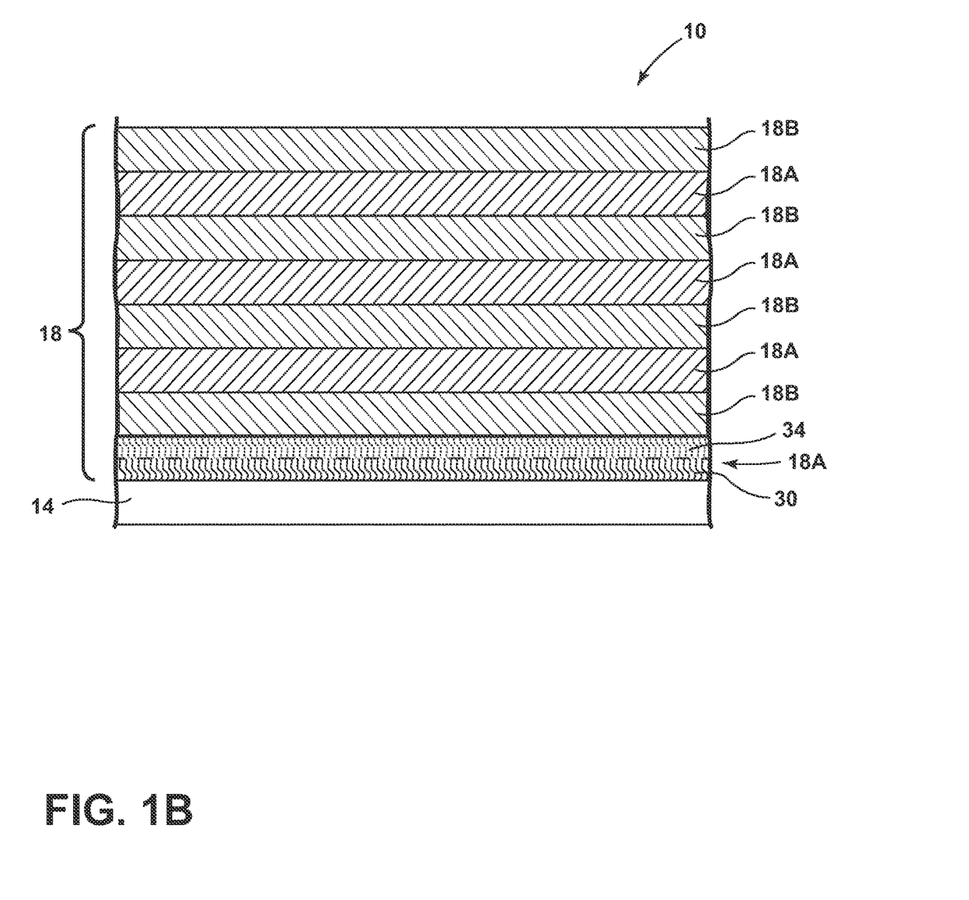
FIG. 1B is an enlarged cross-sectional view of an optics system component according to another embodiment of the disclosure.

Referring now to FIG. 1B, another embodiment of the optics system component 10 is shown that does not incorporate the buffer layer 22, but rather, utilize a layer (e.g., the first or second dielectric layer 18A, 18B) of the optical coating 18 to prevent damage to the substrate 14. In the depicted embodiment, the first dielectric layer 18A is split into two components, a barrier layer 30 (e.g., a first portion) and a standard layer 34 (e.g., a second portion). The standard layer 34 may comprise dielectric material deposited under standard plasma deposition conditions (i.e., the same conditions as the first and second dielectric layers 18A, 18B). The barrier layer 30 is positioned on top of the substrate 14 and the standard layer 34 is positioned between the barrier layer 30 and the second dielectric layer 18B. The barrier layer 30 and the standard layer 34 may be composed of the same dielectric material (e.g., $Ta_2O_5$, $NbO_5$, $TiO_2$, $HfO_2$, $SiO_2$, and mixtures thereof). The dielectric material of the barrier layer 30 and the standard layer 34 may have a high index of refraction or a low index of refraction. The barrier layer 30 may have a thickness between about 1 nm and about 20 nm, or between about 5 nm and about 10 nm. The standard layer 34 may have a thickness between about 30 nm and about 50 nm. In some embodiments, the overall thickness of the barrier layer 30 and the standard layer 34 may be the same as the other first dielectric layers 18A, or it may be different.

Similarly to that of the buffer layer 22, the barrier layer 30 may be applied to the substrate 14 at a plasma bias voltage of between about 50 V and about 90 V, or about 55 V to about 85 V. After the deposition of the barrier layer 30 the standard layer 34 may be deposited on the barrier layer 30 at a voltage between about 100 V and about 130 V, or between about 110 V and about 120 V. Just as the buffer layer 22 shields the substrate 14 from potentially damaging plasma during application of the optical coating 18, so too does the barrier layer 30 shield the substrate 14 from potentially damaging plasma during deposition of the standard layer 34 and the following layers (e.g., first and second dielectric layers 18A, 18B) of the optical coating 18. In a specific example, the standard layer 34 may be applied at the same plasma bias voltage first and second dielectric layers 18A, 18B and may have a thickness great enough that the combined thicknesses of the barrier layer 30 and the standard layer 34 is approximately that of the first or second dielectric layers 18A, 18B.

Use of the barrier layer 30 and standard layer 34 may allow for the realization of several advantages. Just as with use of the buffer layer 22, the thinness of the barrier layer 30, which was deposited at a non-ideal plasma bias voltage, relative to the thickness of the optical coating 18, which was deposited at an ideal plasma bias voltage, may lead to low (e.g., less than about 1.0%, less than about 0.5%, less than about 0.4%, less than about 0.3%, less than about 0.2%, and less than about 0.1%) transmittance loss of electromagnetic radiation through the optics system component 10. Additionally, by utilizing a portion of one of the first or second dielectric layers 18A, 18B, the plasma deposition process may be continuous between the barrier layer 30 and the standard layer 34 such that does not need to be halted. This may be advantageous as it would reduce the chances of particle contamination occurring at interfaces between layers (e.g., first dielectric layer 18A, second dielectric layer 18B, standard layer 34, and barrier layer 30) of the optical coating 18.

Figure 2:
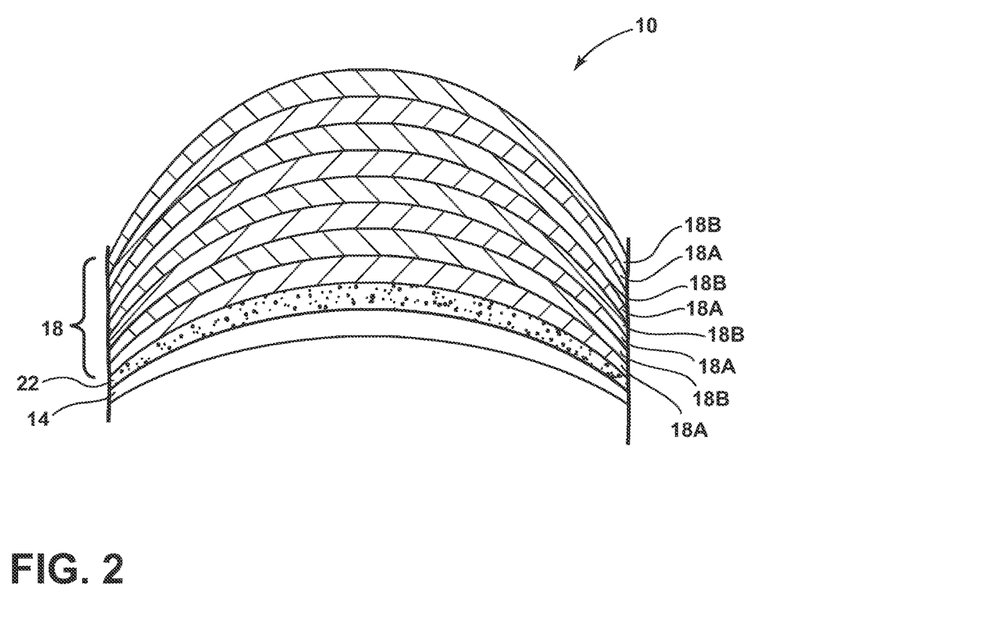
FIG. 2 is an enlarged cross-sectional view of an optics system component according to yet another embodiment of the disclosure.

Referring now to the depicted embodiment of FIG. 2, the optical component 10 may be a lens. In such an embodiment, layers (e.g., the first dielectric layer 18A, second dielectric layer 18B, standard layer 34, and barrier layer 30) of the optical coating 18 may vary in thickness across the length of the substrate 14. In one embodiment, the optical coating 18 and/or barrier layer may be thicker towards central portion of the substrate 14 and become thinner towards edges of the substrate 14. In an alternative embodiment, the optical coating 18 and/or barrier layer may be thinner towards central portion of the substrate 14 and become thicker towards edges of the substrate 14.

EXAMPLES

FIGS. 3A-5B are graphs depicting reflectance or transmittance data about specific examples of the optics system component 10 made according to various aspects of this disclosure.

Figure 3A:
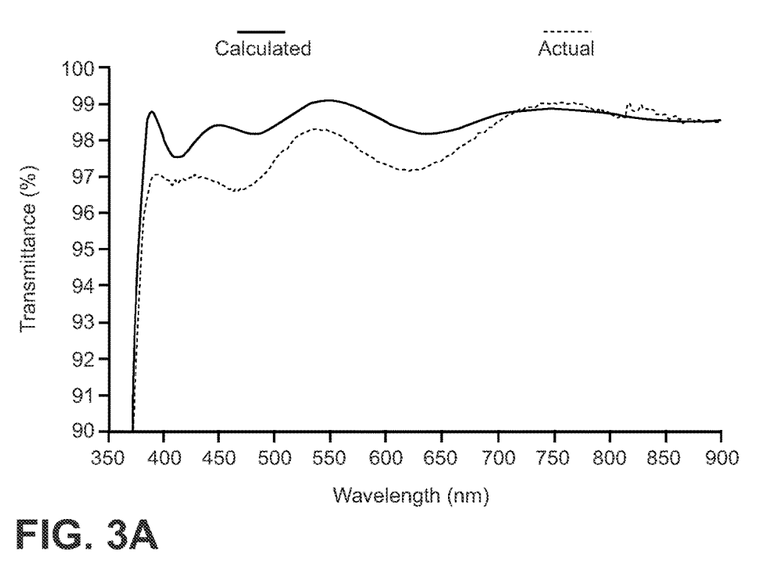
FIG. 3A is a graph depicting the transmittance of an optics system component made according to an aspect of this disclosure.

FIG. 3A depicts the calculated and actual transmittance values for a 3.4 mm thick glass sample (e.g., component 10)

containing fluorides. Coated on both sides of the sample is an anti-reflective film (e.g., optical coating 18) which has been deposited via plasma deposition at a plasma bias voltage of 110 V for 100 seconds without a buffer layer 22 or a barrier layer 30. As can be seen by the graph, the sample has a transmittance loss (calculated transmittance minus the transmittance of the sample) of between about 1% to about 2.5% over a wavelength of between 375 nm and 700 nm.

Figure 3B:
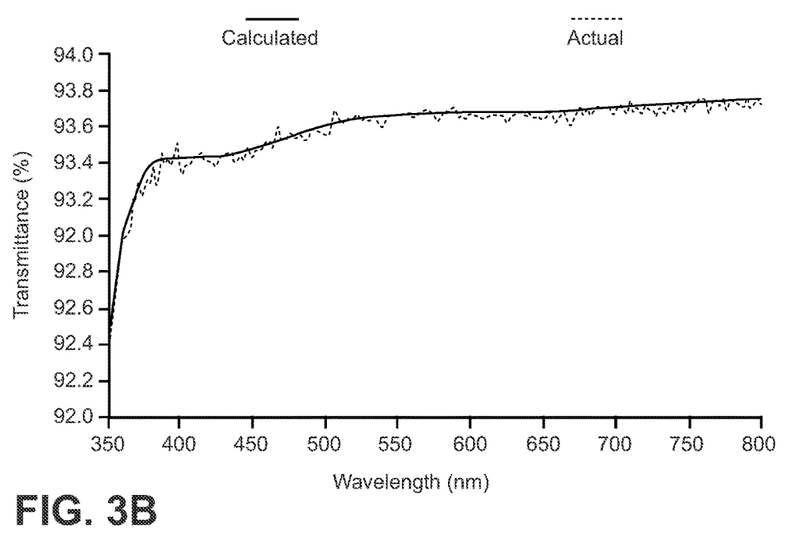
FIG. 3B is a graph depicting the transmittance of an optics system component made according to an aspect of this disclosure.

Referring now to FIG. 3B, depicted is the calculated and actual transmittance values for a 3.4 mm thick glass sample (e.g., substrate 14) containing fluorides. The sample has undergone a plasma deposition at a plasma bias voltage of 55 V for 100 seconds. As can be seen, there is no appreciable difference between the transmittance of the sample and the calculated value indicating that the plasma deposition was done at a low enough plasma bias voltage to not damage the glass of the sample. In other words, the plasma deposition was carried out under conditions which did not exceed the thermal damage threshold of the sample.

Figure 4A:
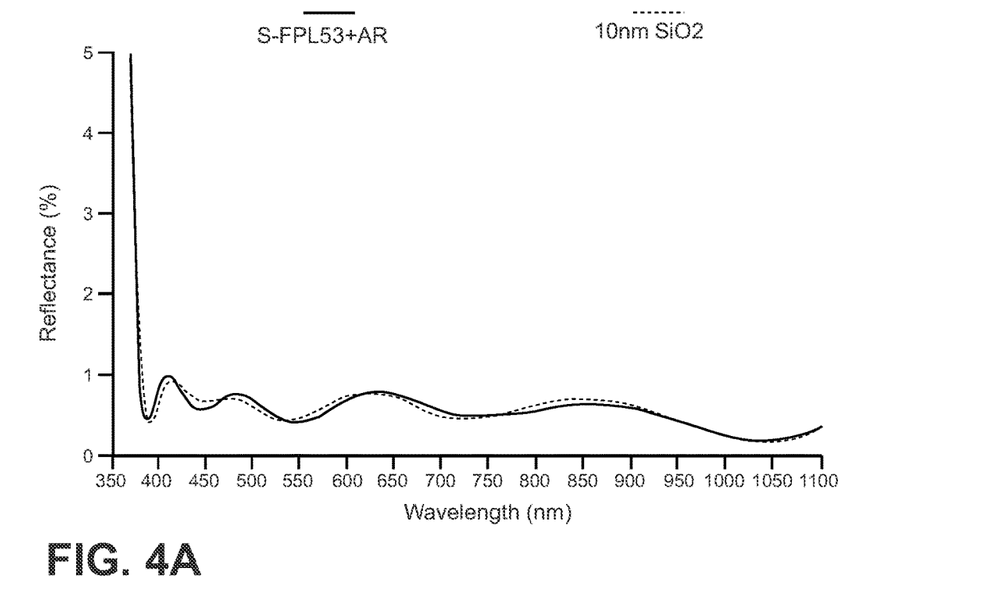
FIG. 4A is a graph depicting the reflectance of an optics system component made according to an aspect of this disclosure.
Figure 4B:
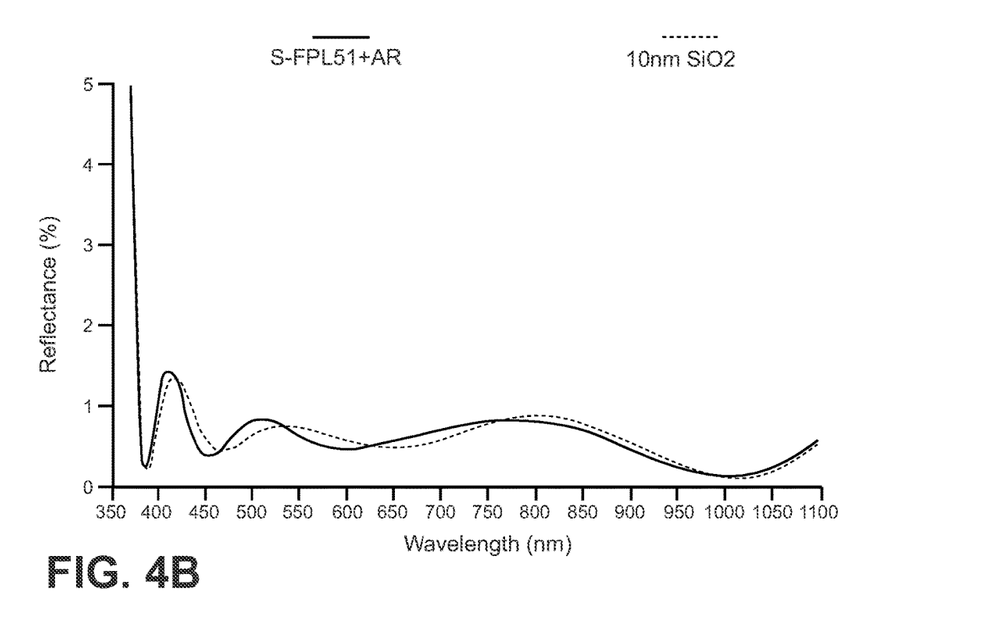
FIG. 4B is a graph depicting the reflectance of an optics system component made according to an aspect of this disclosure.

Referring now to FIGS. 4A and B, depicted are different compositions of glass samples containing fluorides, both with and without 10 nm $SiO_2$ buffer layers positioned between the samples and an antireflective coating. As can be seen, the addition of the $SiO_2$ layer (e.g., buffer layer 22) only slightly affects the reflectance of the samples as compared to the samples without the $SiO_2$ layer. These results indicate that the $SiO_2$ layer (e.g., buffer layer 22) may be introduced without highly detrimental results to the reflectance of the sample (e.g., substrate 14) or film (e.g., optical coating 18).

Figure 5A:
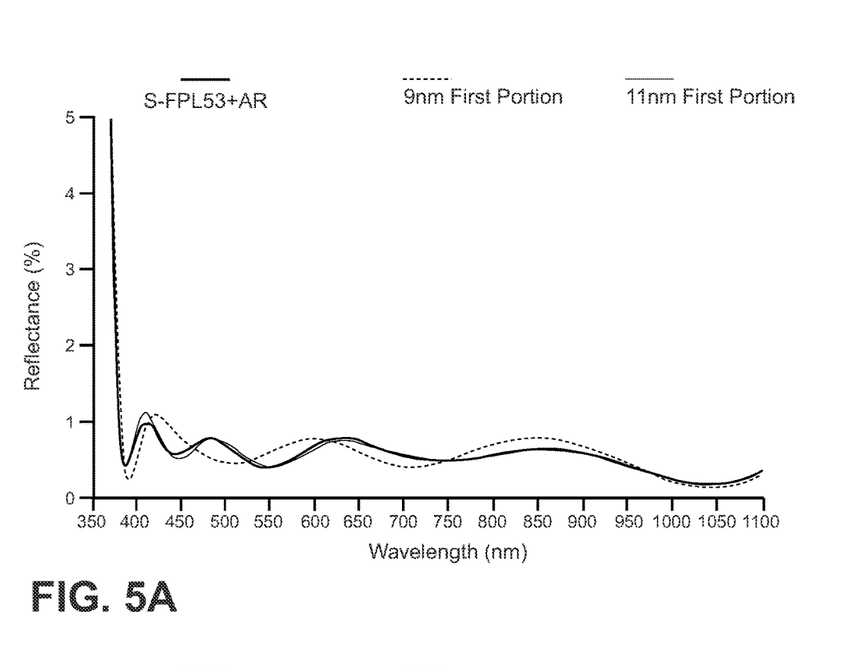
FIG. 5A is a graph depicting the reflectance of an optics system component made according to an aspect of this disclosure.
Figure 5B:
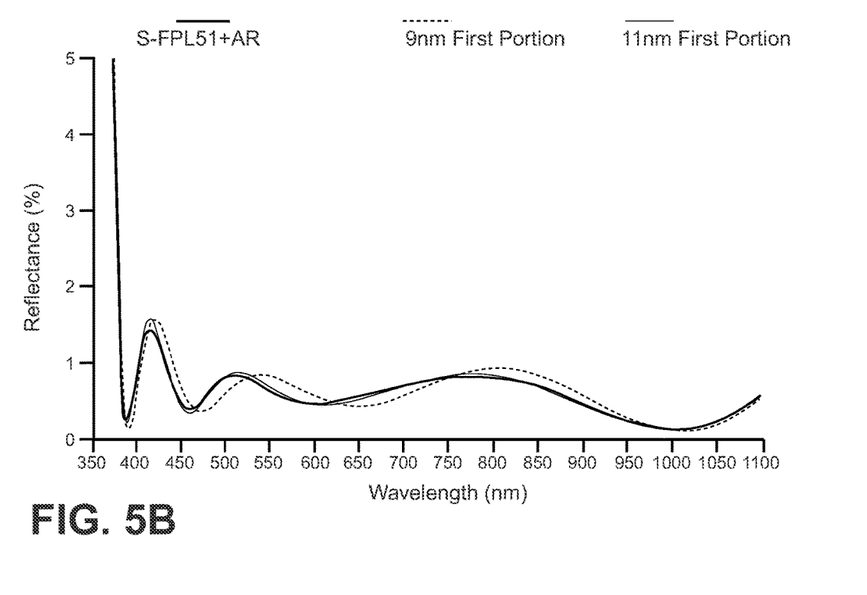
FIG. 5B is a graph depicting the reflectance of an optics system component made according to an aspect of this disclosure.

Referring now to FIGS. 5A and 5B, depicted are glass samples containing fluorides having an anti-reflective film applied according to an embodiment of this disclosure. The graphs depict the reflectance of the samples when a first layer of the anti-reflective film is applied in two different manners to form two portions (e.g., formation of the barrier layer 30 and standard layer 34). As disclosed above, the non-optimal plasma bias voltage which lays down the first portion (e.g., barrier layer 30) may lead to a decrease in the refractive index of the material of the first portion. As seen in FIGS. 5A and B, the 9 nm first portion has a mismatch in reflectance with the reflectance of the glass sample. However, as also explained above and shown in in FIGS. 5A and B, the lower refractive index of the first portion may be corrected to increase the refractive index by increasing the thickness of the first portion (i.e., in this case from about 9 nm to about 11 nm).

TABLE 1

$Ta_2O_5$ single layer properties

| | Run # | | | | | |
|---|---|---|---|---|---|---|
| | K7-7314 | K7-7304 | K7-7305 | K7-7308 | K7-7306 | K7-7307 |
| Vb (V) | Plasma shuttered | PVD only | 55 | 75 | 85 | 110 |
| n at 550 nm | 1.952 | 2.062 | 2.059 | 2.118 | 2.156 | 2.159 |
| RMS (nm) | 3.6 | 2.9 | 3.2 | 2.8 | 1.3 | 1.2 |
| RPD (%) | 88.0 | 94.6 | 94.5 | 97.8 | 99.8 | 100.0 |

Referring to Table 1, depicted is a summary of $Ta_2O_5$ single layer properties under a variety of plasma deposition conditions. Vb(V) represents the plasma bias voltage used, n at 550 nm represents the refractive index of the $Ta_2O_5$ at a light wavelength of 550 nm, RMS represents the surface roughness of the $Ta_2O_5$ after deposition, and RPD represents the packing density of the $Ta_2O_5$ after deposition. As can be seen in Table 1, increasing plasma voltage increases the refractive index, decreases the surface roughness, and increases the packing density of the $Ta_2O_5$ as it is deposited, which are all generally considered to be good qualities in a coating or film.

While the embodiments disclosed herein have been set forth for the purpose of illustration, the foregoing description should not be deemed to be a limitation on the scope of the disclosure or the appended claims. It will be apparent to those skilled in the art that various modifications and variations can be made without departing from the spirit or scope of the claims.

It will be understood by one having ordinary skill in the art that construction of the described invention and other components is not limited to any specific material. Other exemplary embodiments of the invention disclosed herein may be formed from a wide variety of materials, unless described otherwise herein. In this specification and the amended claims, the singular forms "a," "an," and "the" include plural reference unless the context clearly dictates otherwise.

Where a range of values is provided, it is understood that each intervening value, to the tenth of the unit of the lower limit, unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated. It will be apparent to those skilled in the art that various modifications and variations can be made without departing from the spirit or scope of the claims.

What is claimed is:

1. A method of forming an optical system component, comprising the steps of:
    depositing a first portion of a first layer of an optical coating via plasma deposition on a glass substrate at a first plasma bias voltage, wherein the glass substrate comprises one or more fluorides and the first portion has a thickness from about 5 nm to about 10 nm and the overall thickness of the first layer is greater than about 20 nm;
    depositing a second portion of the first layer of the optical coating via plasma deposition on the first portion at a second plasma bias voltage, wherein the second plasma bias voltage is greater than the first plasma bias voltage; and
    depositing a second layer of the optical coating on the first layer.

2. The method of claim 1, wherein a thermal damage threshold of the glass substrate is less than about 500° C.

3. The method of claim 2, wherein the first plasma bias voltage is between about 50 V and about 90 V.

4. The method of claim 1, wherein the first layer comprises a material having a refractive index greater than about 2.0.

5. The method of claim 1, wherein the first portion of the first layer has a packing density of about 90% or greater.

6. The method of claim 5, wherein the first portion and second portion of the first layer comprise a same dielectric material.

7. The method of claim 1, wherein the optical coating comprises layers of alternating dielectric materials, the first layer comprising at least one of $Ta_2O_5$, $Nb_2O_5$, $TiO_2$, and $HfO_2$, and the second layer comprising $SiO_2$.

8. The method of claim 1, wherein the glass substrate with the optical coating has a transmittance loss of the electromagnetic radiation of less than about 0.1% over an electromagnetic wavelength of about 350 nm to about 800 nm.

9. A method of forming an optical coating, comprising the steps:
    providing a glass substrate;
    depositing a buffer layer on the substrate via plasma deposition at a first plasma bias voltage; and
    depositing at least one layer of an optical coating on the buffer layer via plasma deposition, the deposition of the optical coating carried out at a second plasma bias voltage,
    wherein the second plasma bias voltage is greater than the first plasma bias voltage and the buffer layer has a packing density greater than about 94%.

10. The method of forming an optical coating of claim 9, wherein the first plasma bias voltage ranges from about 50 V to about 90 V and the second plasma bias voltage ranges from about 100 V to about 140 V.

11. The method of forming an optical coating of claim 10, wherein the glass substrate comprises at least one fluoride.

12. The method of forming an optical coating of claim 11, wherein at least one of the buffer layer and the optical coating layers has a non-uniform thickness across the glass substrate.

13. The method of forming an optical coating of claim 12, wherein the buffer layer and the at least one layer of the optical coating comprise the same material.

14. A method of forming an optical system component, comprising the steps:
    depositing a buffer layer on a substrate comprising glass, wherein the buffer layer is deposited via plasma deposition at a first plasma bias voltage; and
    depositing at least one layer of an optical coating on the buffer layer via plasma deposition, the deposition of the optical coating carried out at a second plasma bias voltage,
    wherein the buffer layer has a packing density of about 94% or greater.

15. The method of forming an optical system component of claim 14, wherein at least one of the buffer layer and the optical coating has a non-uniform thickness across the substrate.

16. The method of forming an optical system component of claim 14, wherein the buffer layer and the at least one layer of the optical coating comprise the same material.

17. The method of forming an optical system component of claim 14, wherein the substrate comprises one or more fluorides and the buffer layer has a thickness between about 5 nm and about 10 nm.

18. The method of forming an optical system component of claim 14, wherein the first plasma bias voltage is between about 50 V and about 90 V.

19. The method of forming an optical system component of claim 14, wherein the optical coating comprises at least one of $Ta_2O_5$, $Nb_2O_5$, $TiO_2$, and $HfO_2$.

* * * * *